(12) United States Patent
Moser et al.

(10) Patent No.: US 8,378,691 B2
(45) Date of Patent: Feb. 19, 2013

(54) SELF-GUIDING INSTRUMENT CARRIER FOR IN-SITU OPERATION IN A GENERATOR

(75) Inventors: Roland Moser, Zurich (CH); Jörgen Rönnqvist, Vàsteras (SE)

(73) Assignee: ALSTOM Technology Ltd., Baden (CH)

( * ) Notice: Subject to any disclaimer, the term of this patent is extended or adjusted under 35 U.S.C. 154(b) by 765 days.

(21) Appl. No.: 12/330,853

(22) Filed: Dec. 9, 2008

(65) Prior Publication Data

US 2009/0146680 A1 Jun. 11, 2009

(30) Foreign Application Priority Data

Dec. 10, 2007 (EP) .................................... 07122755

(51) Int. Cl.
*G01R 31/34* (2006.01)
*G01R 31/06* (2006.01)
(52) U.S. Cl. .................................. 324/545; 324/765.01
(58) Field of Classification Search ........................ None
See application file for complete search history.

(56) References Cited

U.S. PATENT DOCUMENTS

| | | | | |
|---|---|---|---|---|
| 2,596,322 A | * | 5/1952 | Zumwalt | 33/21.1 |
| 4,803,563 A | | 2/1989 | Dailey et al. | |
| 5,186,270 A | * | 2/1993 | West | 180/6.62 |
| 5,363,935 A | * | 11/1994 | Schempf et al. | 180/9.1 |
| 5,365,166 A | * | 11/1994 | Dailey et al. | 324/750.22 |
| 5,557,216 A | * | 9/1996 | Dailey et al. | 324/750.16 |
| 5,609,107 A | * | 3/1997 | Viola et al. | 105/77 |
| 5,635,780 A | | 6/1997 | Kohlert et al. | |
| 6,100,711 A | | 8/2000 | Hatley | |
| 6,791,351 B2 | * | 9/2004 | Fischer et al. | 324/765.01 |
| 7,201,055 B1 | * | 4/2007 | Bagley et al. | 73/618 |
| 7,208,971 B2 | * | 4/2007 | Lee et al. | 324/750.25 |
| 7,520,189 B2 | * | 4/2009 | Abbasi et al. | 73/865.9 |
| 2002/0104693 A1 | * | 8/2002 | Moore et al. | 180/9.1 |
| 2002/0135383 A1 | | 9/2002 | Haeusermann et al. | |
| 2008/0098832 A1 | * | 5/2008 | Abbasi et al. | 73/865.9 |

FOREIGN PATENT DOCUMENTS

| | | |
|---|---|---|
| EP | 0647312 | 4/1995 |
| EP | 0684483 | 11/1995 |
| EP | 1772949 | 4/2007 |
| EP | 1862381 | 12/2007 |
| WO | WO94/18574 | 8/1994 |

OTHER PUBLICATIONS

Search Report for EP Patent App. No. 07122755.7 (Jun. 11, 2008).

* cited by examiner

*Primary Examiner* — Paresh Patel
(74) *Attorney, Agent, or Firm* — Cermak Nakajima LLP; Adam J. Cermak

(57) ABSTRACT

Removal of the rotor of a large electrical machine is costly and time consuming, and in particular the outage time of a power plant, which is needed for the removal of a generator rotor, is very expensive and should be minimized. To avoid opening of the generator for inspection and maintenance instrument carriages can be used. A method allows the reliable guidance for an in-situ instrument carrier inside the annular gap of a generator and a corresponding instrument carrier. The method avoids the use of sensors and active control systems for the guidance of the instrument carrier. A passively self-guiding system and method takes advantage of the internal structure of a generator and uses the passive centering properties of magnets to guide the instrument carrier through the annular gap of a generator.

20 Claims, 7 Drawing Sheets

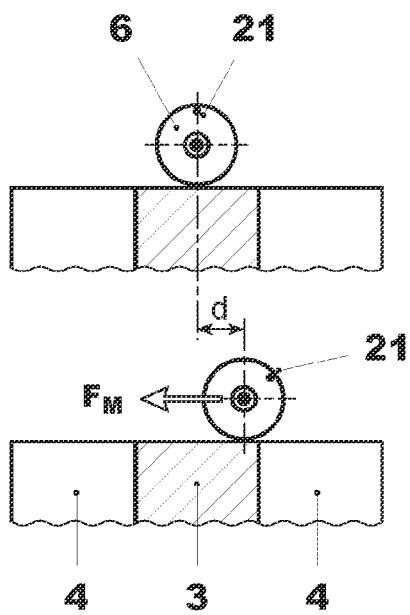
FIG. 4a
FIG. 4b
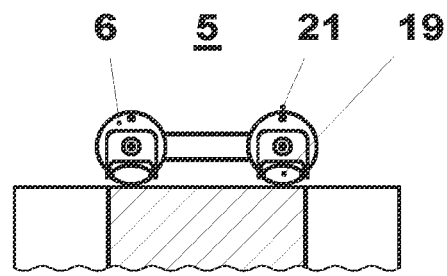
FIG. 5a
FIG. 5b
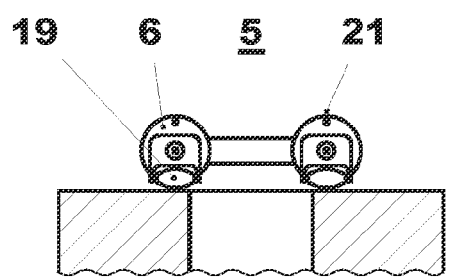
FIG. 6a
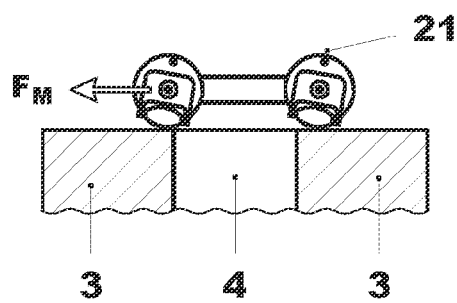
FIG. 6b

SELF-GUIDING INSTRUMENT CARRIER FOR IN-SITU OPERATION IN A GENERATOR

This application claims priority under 35 U.S.C. §119 to European application no. 07122755.7, filed 10 Dec. 2007, the entirety of which is incorporated by reference herein.

BACKGROUND

1. Field of Endeavor

The invention relates to a method for self-guiding an instrument carrier during in-situ operation in a generator, as well as to an instrument carrier designed for guidance according to this method.

2. Brief Description of the Related Art

Electrical machines transform mechanical energy into electrical energy (generator) and vice versa (motor). Electrical machines usually include a rotor and a stator. The rotor rotates within a bore that is provided in the stator.

The accessibility to stator and rotor is very limited and only possible through a narrow gap between rotor and stator while the rotor is in place. Removal of the rotor of a large electrical machine is costly and time consuming. Especially the outage time of a power plant, which is needed for the removal of a generator rotor, is very expensive and should be minimized to assure high availability of the plant. However, access to the rotor and stator is required for maintenance and inspection of the generator.

To avoid opening of the generator for inspection and maintenance, different devices designed to inspect the generator through the annular gap between stator and rotor, which is also commonly called an air gap, have been proposed. In the WO94/18574 a device that has a complicated sensing and control system to guide the device through the gap is proposed. The main goal of its electrical sensors is to detect the difference in electrical conductivity between generator wedges and iron and to use these as input for the control system. In U.S. Pat. No. 6,100,711, a miniature air gap inspection device is proposed, which has a complex drive and control system and which is remotely operated with the use of a high-resolution camera. Electronic systems that steer a device through the annular gap are cumbersome and a potential source of failure.

SUMMARY

One of numerous aspects of the present invention includes a method which allows the reliable guidance for an in-situ instrument carrier inside the annular gap of a generator. The instrument or tool itself can be an inspection tool, as for example a camera, an ultrasonic sensor, etc., or a small robot for repair work. Movement in the axial direction is realized in a conventional way, for example by a manual pushing rod.

One advantage of this method is that it avoids the use of sensors and active control systems for the guidance of the instrument carrier. This increases its reliability and reduces its space requirements. As space inside the annular gap is confined and access height to the annular gap is often only half of the annular gap height, a small design is essential.

In order to avoid cumbersome sensors and control systems a passively self-guiding system and method is proposed. To realize a self-guiding instrument carrier, another aspect of the present invention involves taking advantage of the internal structure of the generator. The generator rotor is made out of highly ferromagnetic steel and axially extending wedges out of practically non-magnetic material like, for example, stainless steel or aluminum. Hence, a rail-like structure of alternating ferromagnetic and non-magnetic bars is present in each rotor. Analogously, the stator iron and stator winding provide an axially extending rail like structure in the stator. Methods embodying principles of the present invention use the difference in magnetism along these rail like structures to guide an instrument carrier in the axial direction on the rotor surface and stator surface, respectively.

Any magnet will be drawn by the magnetic force from the non-magnetic bars to the ferromagnetic bars. With suitable geometric arrangement, self-centering of a magnet or arrangement of magnets by magnetic force can be realized on the bars of these rail-like structures. The method described herein is based on this phenomenon.

Besides the method of passive self-centering for guidance, another aspect of the present invention includes a passively self-centering instrument carrier. A passively self-centering instrument carrier can be realized by combining the self-centering magnet or magnet arrangement with a carriage, which has wheels, balls, rollers, or the like, which allow the movement. For self-guiding this instrument carrier in the axial direction, no mechanical rails, sensors, visualization system or control system is required. Guidance is therefore absolutely reliable as it works independently of any sensing component, which could cause failures. It can be realized in a compact form suitable for application in the restricted area of an annular gap.

Movement can easily be realized by an electrical motor or simply by a manually operated pushing rod, which is connected to the instrument carrier and inserted into the annular gap together with the instrument carrier from one end of the generator. This can for example be the axial movement in the direction of the rotor axis.

The above and other aspects, features, and advantages of the present invention will become apparent from the following description, taken in conjunction with the accompanying drawings.

For example, principles of this invention can also be applied to generators where the so-called non-magnetic rails have a noticeable residual magnetism. It is applicable to these kinds of generators as long as there is a significant difference in magnetic permeability between the two rails. The permeability of the ferromagnetic rail should be at least twice the permeability of the non-magnetic rail. Typically the difference in permeability is one order of magnitude or more. If the wedges and windings are made out of aluminum the difference of permeability of the ferromagnetic rails is several orders larger than the permeability of the non-magnetic section.

Depending on the design of the stator and rotor, there are mechanical steps between the ferromagnetic and non-magnetic sections on the surface facing the annular gap, which can be used to guide an instrument-carrier. In most generator designs these are not present or too small to reliably guide an instrument-carrier. The self-guidance disclosed here does not rely on any such mechanical features and no such steps are mentioned in the following description. However, the self-guidance disclosed here can also be applied to designs with steps between the different sections.

BRIEF DESCRIPTION OF THE DRAWINGS

The invention, its nature as well as its advantages, shall be described in more detail below with the aid of the accompanying drawings. Referring to the drawings:

FIG. 4 a) Schematic of a cylindrical guidance magnet in centered position of ferromagnetic section, b) Schematic of a cylindrical guidance magnet displaced from centered position of ferromagnetic section and resulting magnetic centering force;

FIG. 5 a) Schematic of an arrangement with two cylindrical guidance magnets in the centered position of a ferromagnetic section, b) Schematic of an arrangement with two cylindrical guidance magnets displaced from the centered position of a ferromagnetic section and resulting magnetic centering force;

FIG. 6 a) Schematic of an arrangement with two cylindrical guidance magnets in the centered position on non-magnetic section, b) Schematic of an arrangement with two cylindrical guidance magnets displaced from the centered position on non-magnetic section and resulting magnetic centering force;

DETAILED DESCRIPTION OF EXEMPLARY EMBODIMENTS

Figure 1:
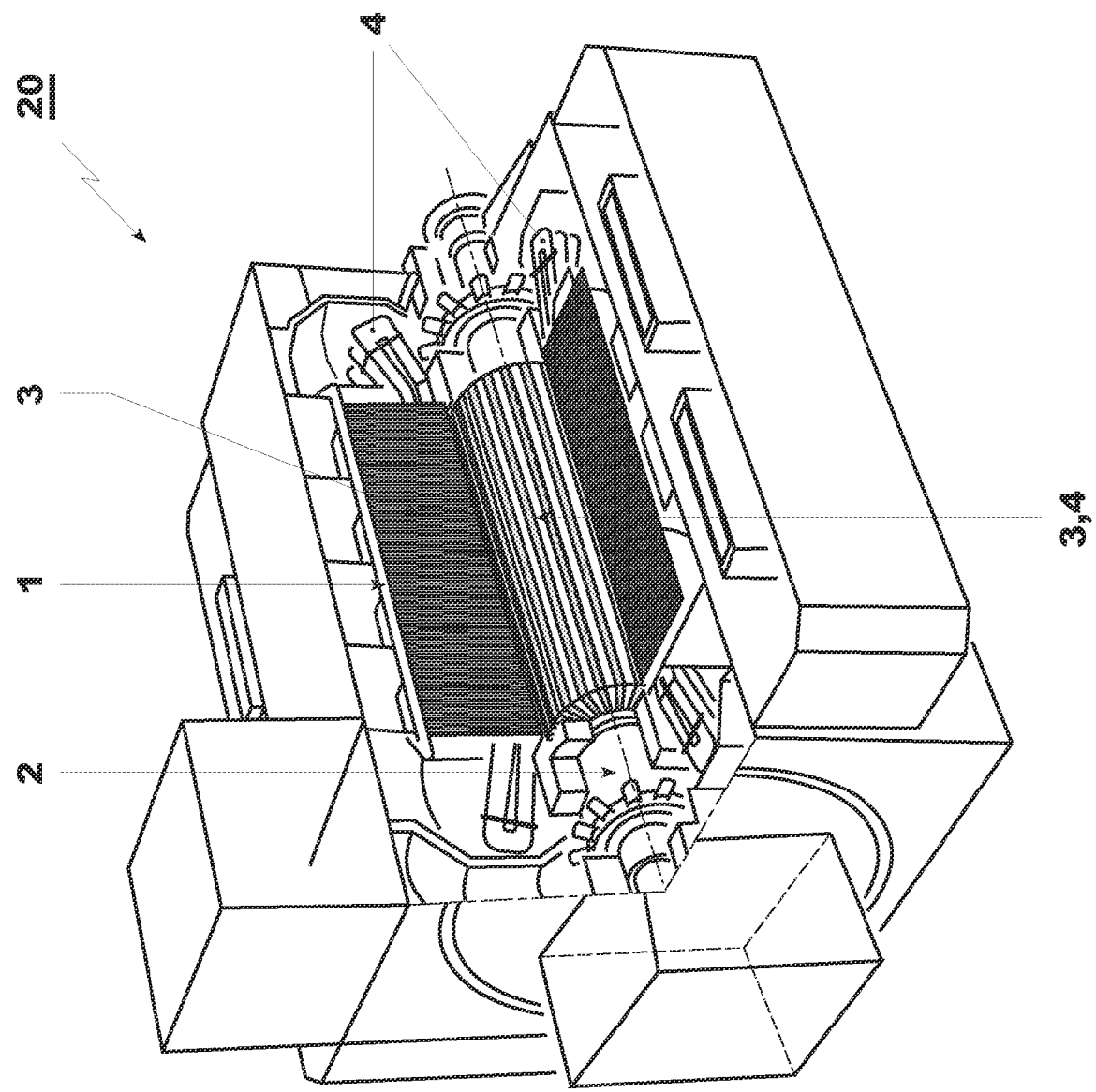
FIG. 1 Perspective view of a generator indication indicating the ferromagnetic and non-magnetic sections of rotor and stator.

A perspective view of a generator 20, indicating the ferromagnetic 3 and non-magnetic 4 sections of rotor 2 and stator 1, is shown in FIG. 1.

Figure 2:
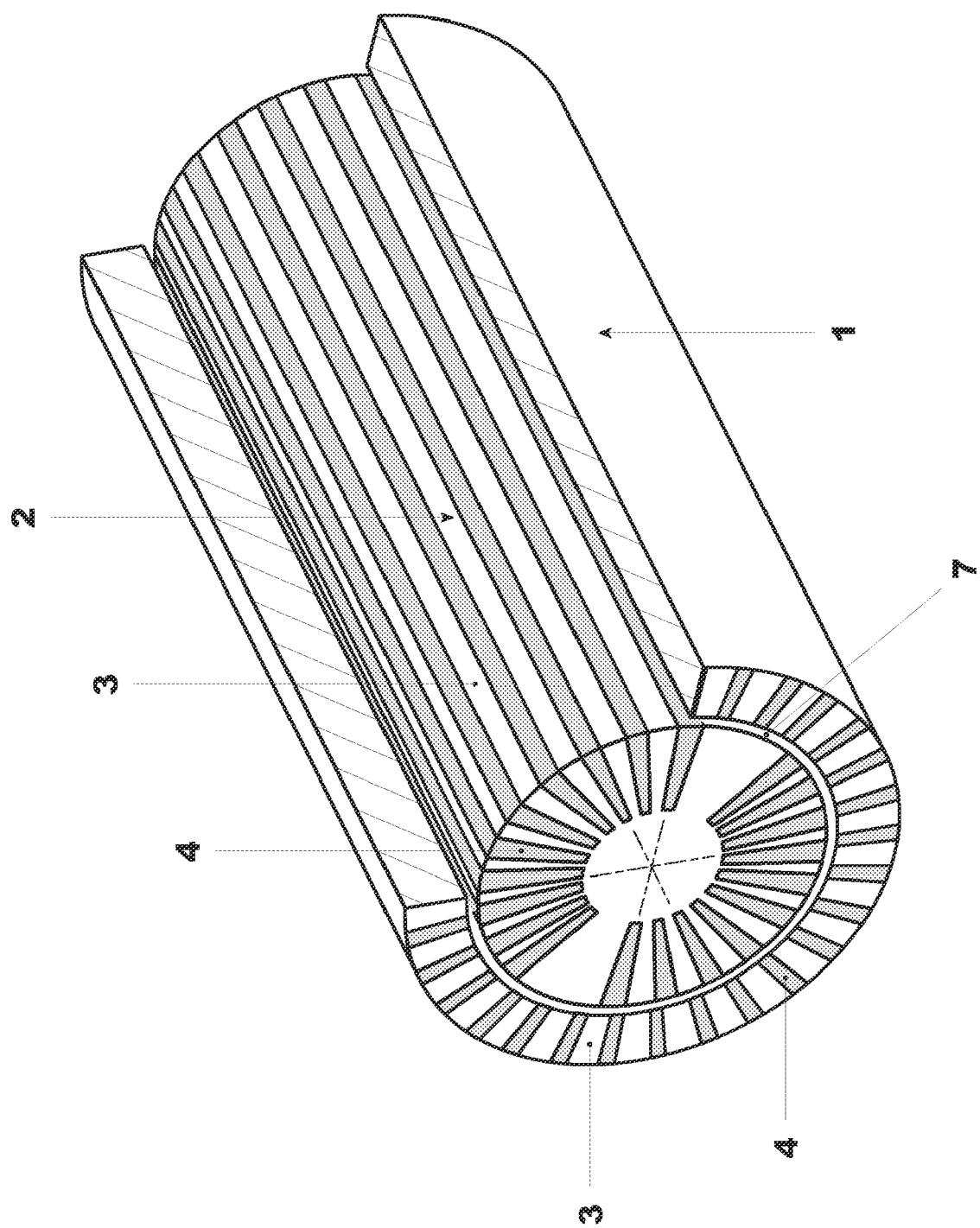
FIG. 2 Schematic cross section of generator stator and rotor indicating ferromagnetic and non-magnetic sections.

As a basis for better understanding principles of the invention, the cross section of a generator rotor 2 and stator 1 is schematically shown in FIG. 2. The rotor 2 and stator are separated by an annular gap 7. The surface of the rotor and the stator facing the annular gap is made out of ferromagnetic 3 and non-magnetic material 4. Ferromagnetic 3 and non-magnetic 4 materials are used alternately and as indicated in FIG. 2. The width of ferromagnetic sections and the width of non-magnetic sections are typically constant on the stator side. On the rotor side they are typically also constant except in the region of the magnetic poles of the rotor. Depending on the design, there are no grooves in the pole region of the generator rotor and, therefore, no rotationally symmetric changes between ferromagnetic and non-magnetic rails in this area. However, even in these regions the geometry is known and often simply has wider ferromagnetic sections and it is therefore no problem to adapt a carriage to inspect these regions.

For the rotor, the ferromagnetic material 3 is the ferromagnetic rotor itself. Parallel to the rotor axis, slots are machined into the rotor into which the rotor windings are inserted and which are closed by wedges. The wedges, as well as the windings, are the non-magnetic 4 sections of the rotor 2. They are for example made out of copper, aluminum, or stainless steel.

For the stator 1, the ferromagnetic material 3 is the stator iron, and the non-magnetic material 4 are the stator windings.

On the stator and rotor side the alternating ferromagnetic and non-magnetic section extend parallel and in the axial direction of the generator. They therefore form a rail-like structure. In the following, the ferromagnetic material 3 in this structure is referred to as ferromagnetic rail 3; the non-magnetic material 4 in this structure is referred to as non-magnetic rail 4.

To understand the application of the self-guiding instrument carrier 17, one schematic example of such a carrier is explained with reference to FIG. 3. The basic principle used to guide a carriage 5 or a self-guiding instrument carrier 17 on these rail-like structures is explained with the help of FIG. 4. Alternative embodiments to realize the self-guiding carriage 5 are shown in FIGS. 5 and 6. A second example of a self-guiding instrument carrier 17 is explained in FIG. 7.

A self-guiding instrument carrier 17 includes three basic components: a carriage 5; guiding magnets 8; and a payload 18. In this example, carriage 5 and payload 18 are integrated into each other and not shown, as they are part of the instrument carrier 17. The function of the carriage 5 is to carry the guiding magnets 8 and the payload and to allow free movement of the self-guiding instrument carrier 17 in the annular gap 7 of a generator 20. To allow the free movement of the carriage 5, wheels, balls, roller bearings 15, rollers 19, or the like, are used. The payload 18 and guiding magnets 8 can be integrated into the carriage 5 or attached to the carriage. The guiding magnets 8 have to guide the carriage with its payload along the rail-like structure on the rotor and stator, respectively. The payload can be an inspection device or a tool holder or small robot to carry out simple repair or maintenance work, such as for example inserting balancing weights.

Figure 3:
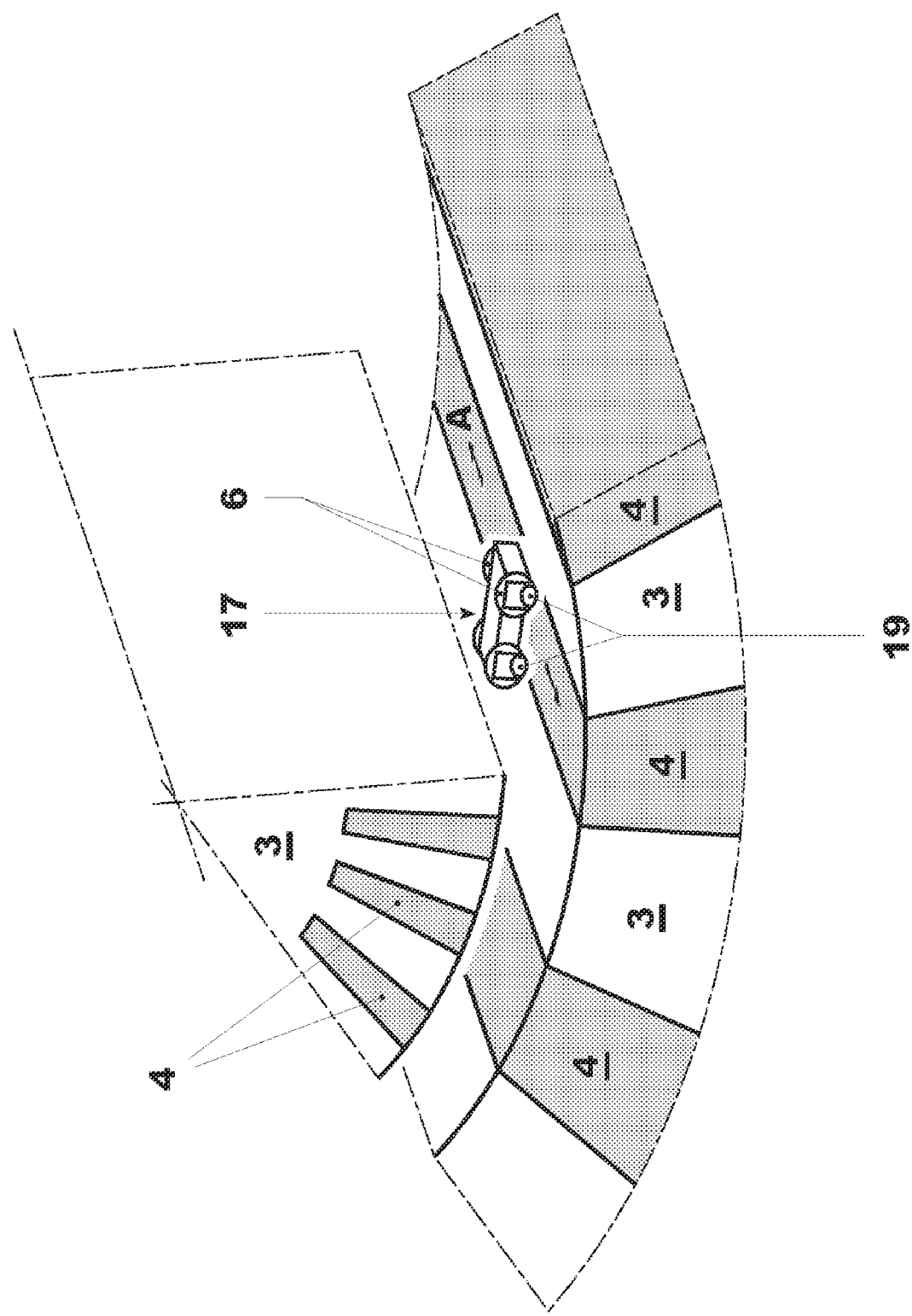
FIG. 3 Schematic cross section of generator stator and rotor indicating a self-guiding carriage on a ferromagnetic rail.

In FIG. 3 part of a schematic generator cross section, with a schematic self-guiding instrument carrier 17, is shown. It shows a combination of axially pivotable cylindrical guidance 6 magnets with rollers 19. The cylindrical guidance magnets 6 are coaxially aligned with the rotor axis and their axes are parallel to the ferromagnetic rail 3. The cylindrical guidance magnets 6 keep the self-guiding instrument carrier 17 centered on the ferromagnetic rail while the rollers 19 allow easy movement in axial direction A. To this end one roller 19 is attached to the end of each axially pivotable cylindrical guidance magnet 6. The axis of the roller is arranged at a right angle to the axis of the cylindrical guidance magnet. The roller 19 is attached to the cylindrical guidance magnet 6 in a way that its outer diameter extends beyond the outer radius of the magnet. Therefore the magnet does not touch the surface of the ferromagnetic rail 3 and the roller 19 allows easy movement of the carriage in the direction of the ferromagnetic rail 3 and therefore in axial direction A of the generator. The rollers, which are attached to the cylindrical guidance magnets 6, are not cylindrical but have a curved outer surface to allow pivoting of the cylindrical guidance magnet 6, when these are displaced from the center position. This curvature can, for example, be a segment of a circle, which has a slightly bigger diameter than the cylindrical guidance magnet 6. Movement, for example axial movement, can easily be realized by an electrical motor or simply by a manually operated pushing rod. Both are not indicated in the Figure.

In FIGS. 4 to 6 the principles of the self-guiding mechanisms are explained. For self-guidance only forces normal to the axial direction of the rails and parallel to the surface of the rails are considered. Further, no magnetic forces in the axial direction are expected, except for in the end regions of the rotor. However, the guidance magnets 6 pull towards the rails at all time.

FIG. 4 a) shows an axially magnetized cylindrical guidance magnet 6 in a centered position of a ferromagnetic rail 3. As long as the axially magnetized cylindrical guidance magnet 6 is in the center of the ferromagnetic rail 3, no guiding magnetic force is exerted on the cylindrical guidance magnet 6. Once the cylindrical guidance magnet 6 is moved out of the center of the ferromagnetic rail 3, as shown in FIG. 4 b), a magnetic force $F_M$ will guide the cylindrical guidance magnet 6 back to the center of the ferromagnetic rail 3.

Figure 9:
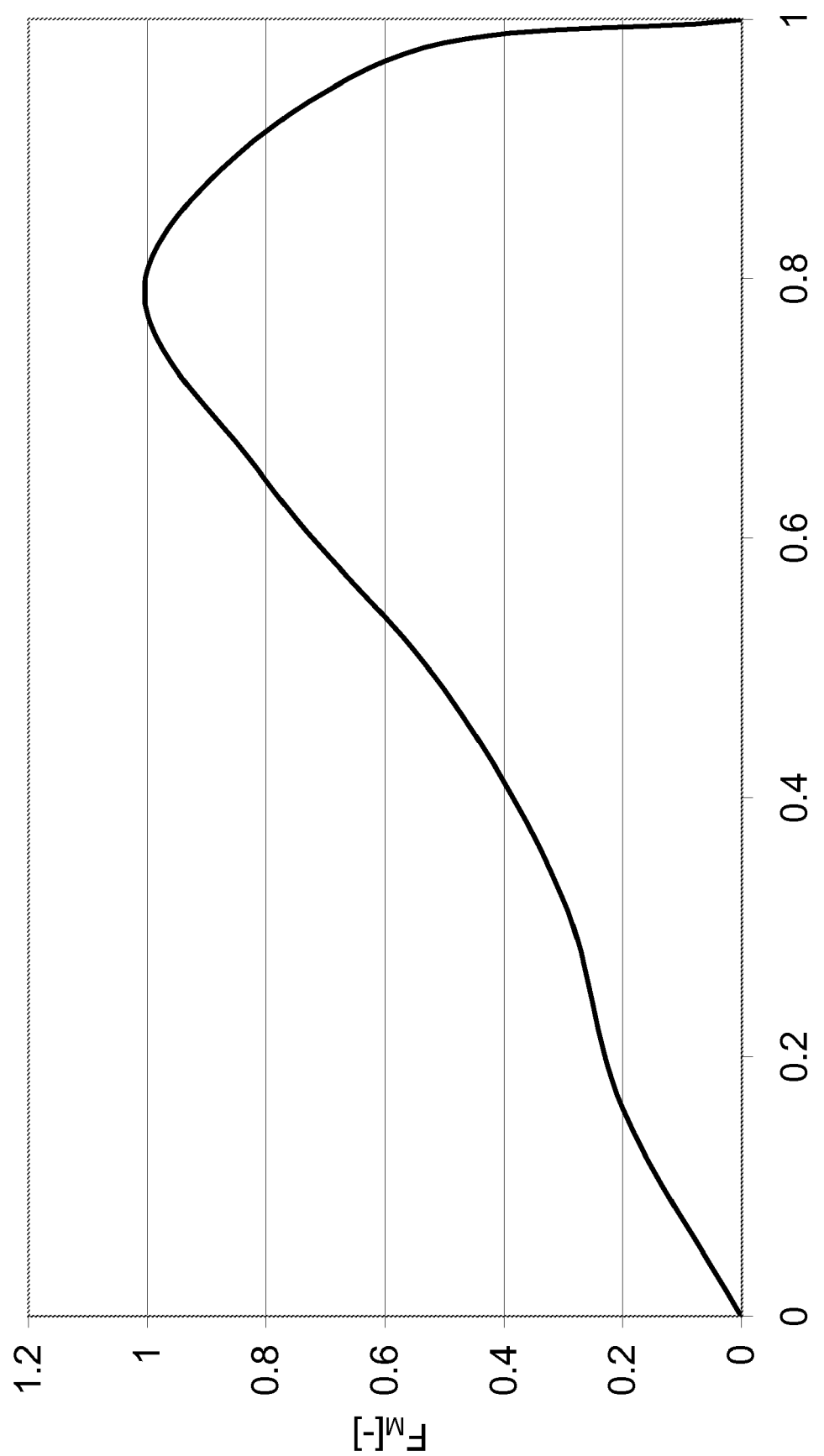
FIG. 9 Typical normalized magnetic guiding force $F_M$ as a function of the normalized deviation d from the centered position on a ferromagnetic rail.

An example of the normalized guiding force $F_M$, as a function of the normalized deviation d from the center of the ferromagnetic rail 3, is shown in FIG. 9. The guiding force $F_M$ is initially proportional to the deviation d from the center of the ferromagnetic rail 3 before it reaches a maximum force. Then the force drops quickly as the cylindrical guidance magnet 6 approaches the center between two ferromagnetic rails 3.

In FIG. 5 a second example of a self-guiding arrangement is illustrated. FIG. 5 a) shows a schematic of a carriage 5, which uses two cylindrical guidance magnets 6 and is centered above the ferromagnetic material 3. The cylindrical guidance magnets 6 are above the ferromagnetic rail 3 close to the border to the respective left and right adjacent non-magnetic rails 4. Both cylindrical guidance magnets 6 are pulled in the direction of the center of the ferromagnetic rail 3 by their magnetic forces. However, they have the same absolute value and cancel each other so that the resulting guiding force is zero. Once this carriage 5 is moved in the direction of one of the non-magnetic rails 4, as shown in FIG. 5 b), the guiding force of the cylindrical guidance magnet 6, which is moved towards the non-magnetic rail 4, increases, while the force of the second cylindrical guidance magnet 6, which is moved towards the center of the ferromagnetic rail 3, decreases. The resulting force is therefore guiding the carriage 5 back to the center of the ferromagnetic rail 3.

Besides illustrating the function of a pair of guiding rails, the figure shows a combination of cylindrical guidance 6 magnets with rollers 19. Here, one roller 19 is attached to the end of each axially pivotable cylindrical guidance magnet 6. The axis of the roller is arranged at a right angle to the axis of the cylindrical guidance magnet 6, which is centering itself parallel to the ferromagnetic guiding rail 3. The roller 19 is attached to the cylindrical guidance magnet 6 in a way that its outer diameter extends beyond the outer radius of the magnet. Therefore, the magnet does not touch the surface of the ferromagnetic rail 3 and the roller 19 allows easy movement of the carriage in the direction of the ferromagnetic rail 3 and therefore in the axial direction of the generator. The rollers, which are attached to the cylindrical guidance magnets 6, are not cylindrical but have a curved outer surface to allow pivoting of the cylindrical guidance magnet 6, when these are displaced from the center position. This curvature can, for example, be a segment of a circle, which has a slightly bigger diameter than the cylindrical guidance magnet 6.

In FIG. 6 a third example of a self-guiding arrangement is illustrated. FIG. 6 a) shows a schematic of another carriage 5, which uses two cylindrical guidance magnets 6. This carriage 5 is guided centered above the non-magnetic rail 4. The cylindrical guidance magnets 6 are above the two ferromagnetic rails 3 close to the border adjacent to both sides of the non-magnetic rail 4. Both cylindrical guidance magnets 6 have a force in the direction of the center of the ferromagnetic rails 3. However, they have the same absolute value and cancel each other so that the resulting force is zero. Once this carriage 5 is moved in the direction of one of the ferromagnetic rails 3, as shown in FIG. 6 b), the guiding force of the cylindrical guidance magnets, which is moved towards the non-magnetic rail 4, increases, while the force of the second cylindrical guidance magnets, which is moved towards the center of the ferromagnetic rail 3, decreases. The resulting force is therefore guiding the carriage 5 back to the center of the non-magnetic rail 4.

Figure 7:
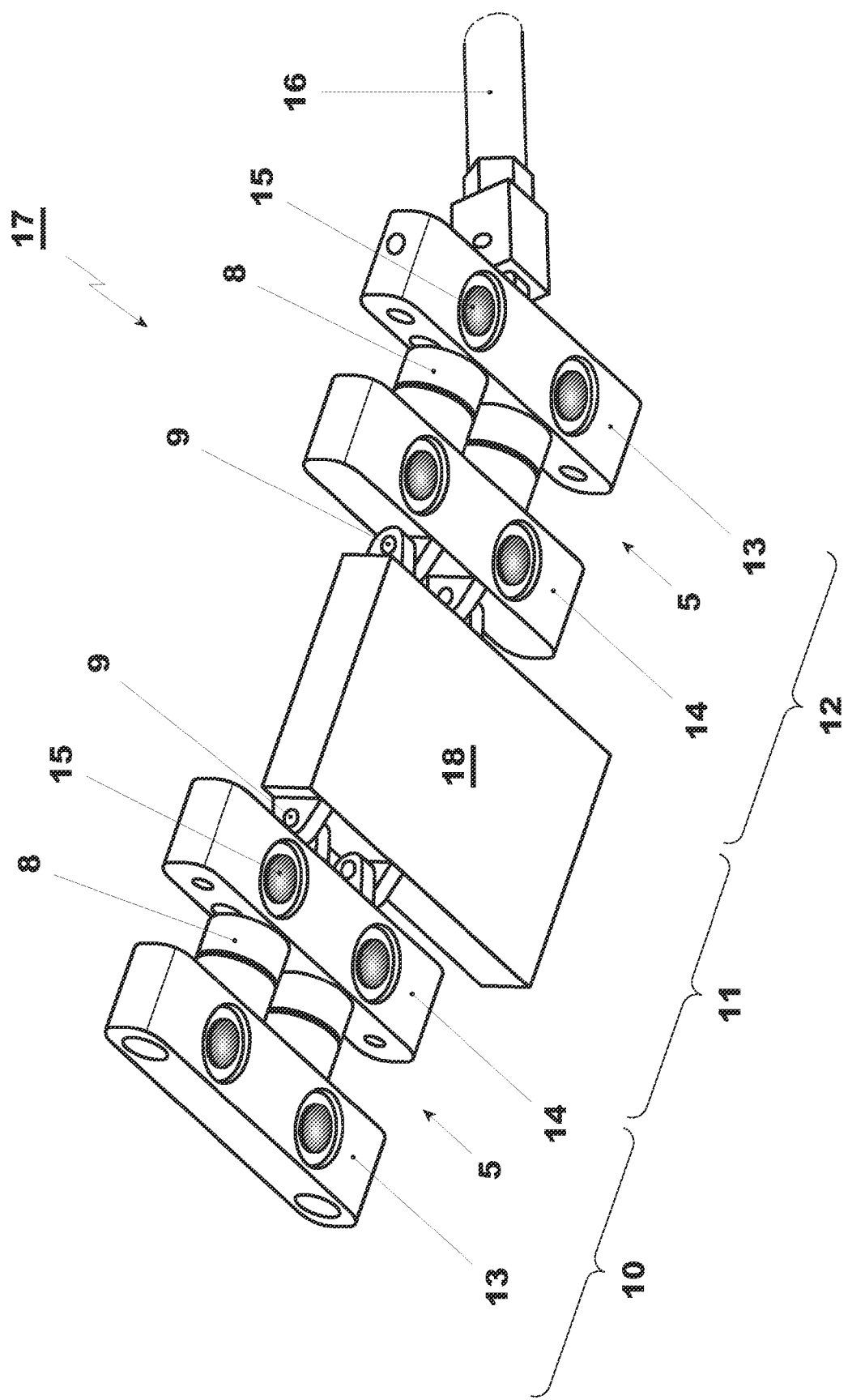
FIG. 7 Example of a self-guiding instrument carrier composed of two carriages and one payload segment.

FIG. 7 shows an example of a self-guiding instrument carrier 17, which is designed to travel through the annular gap 7 of a generator. The annular gap 7 has a substantially constant clearance in the middle section of a rotor 2. This is due to the cylindrical shape of the rotor 2 and the stator bore. The constant clearance has the shape of an annular gap, if viewed axially. Since the rotor 2 and the stator 1 have varying diameters in both terminal region of the rotor 2, usually in front or in the region of retaining rings, the clearance between rotor 2 and stator 1 is varying in these regions. In order to allow the inspection of the rotor, the self-guiding instrument carrier has to be inserted into the annular gap 7 from one of the end sections of the generator and therefore has to pass through sections of the annular gap, which have a varying diameter and height. To facilitate the passage through the end sections of the generator a segmented self-guiding instrument carriers 17 is proposed.

Here, three sections, namely a first section 10, a second section 11, and a third section 12 are suggested. The first section 10 is connected to the second section 11, both of which are moveable with respect of each other. In the present embodiment, the first section 10 is connected to the second section 11 by a hinge 15. Other suitable connections, like for example, flexible rubber, may also be used for that purpose. The third section 12 is connected to the second section 11 in the same manner. Therefore the self-guiding instrument carrier of this example is a structure having three sections 10, 11, 12, which are moveable or pivotable with respect to each other. In this example, the sections 10, 11, 12 are arranged one behind the other, so that a chain-like structure results. The orientation of the chain-like structure is parallel to the axis of the generator.

It is clear that if the length of the chain segments is chosen to be smaller than the limiting axial length, i.e., having a suitable length to pass the terminal section without being blocked by the surfaces of the rotor 2 or stator bore. It is possible that a self-guiding instrument carrier 17 may have only one section. If for some reasons the overall axial length has to be longer, more sections have to be connected together. The number of sections of a self-guiding instrument carrier 17 with a given length depends therefore on the physical characteristics of the terminal region of the generator.

The example of a three-segment device as shown in FIG. 7 is composed of two carriages 5 and payload section 18. The first section 10 and third section 12 are carriages 5, which guide and support the second section 11. The second section 11 is the payload section 18. It can be an inspection device or a tool holder or small robot to carry out simple repair or maintenance work, such as, for example, inserting balancing weights.

For guidance, each carriage 5 includes two guidance magnets 8, which function as was described in the examples given for FIG. 4 to 6. The guidance magnets 8 are arranged between a first yoke 13 and a second yoke 14 in a manner that their central axes are parallel. To allow easy movement of the carriages 5 on the rotor 2, respectively on the stator 1, roller bearings 15 are integrated in the yokes 13 and 14. Small rotor bearings are readily available and have only minimal space requirements.

In the present embodiment, the actuation element is a rod 16 that is pivotably connected to the third section 12. An operator who has to push the rod 16 in order to move the self-guiding instrument carrier 17 will operate the rod. The rod 16 has elastic properties. This is necessary, because the rod 16 has to pass through the terminal region, where the annular gap 7 has a varying clearance. If the rod 16 is hollow, it is possible to supply the self-guiding instrument carrier 17 with at least one of the following supplies: electrical supply, hydraulic fluids, and/or control signals. If electrical energy is to be supplied through the rod 16, suitable devices, such as cables, have to be provided. Such a cable can be arranged inside the rod 16 or it may be mounted for example with clamps on its outer side. Hydraulic fluids, such as oil, air, or water, may be provided in a hose that is arranged in the same manner as described for cables above. It is also possible to use the hollow rod itself as a hose for supplying a fluid to the self-guiding instrument carrier 17.

The normalized guiding force $F_M$ as a function of the normalize deviation d from the center of the ferromagnetic rail 3 is shown in FIG. 9 for the example of an axially magnetic cylindrical magnet which is described in FIG. 4. The guiding force $F_M$ is initially proportional to the deviation d from the center of the ferromagnetic rail 3 before it reaches a maximum force. Then the force drops quickly as the cylindrical guidance magnet 6 approaches the center of the non-magnetic rail 4 between two ferromagnetic rails 3. Similar dependencies of the magnetic force $F_M$ as a function of the deviation d from the center of the ferromagnetic rail and non-magnetic rail, respectively, can be determined for all guiding magnet 8 arrangements.

As long as the self-guiding instrument carrier 17 is running on a horizontal plane, like for example on the 12 o'clock position on top of the rotor 2, the guiding magnet will guide the self-guiding instrument carrier 17 in the center of the rail. In case there are gravitational forces, which pull the self-guiding instrument carrier 17 down to the lower side of a rail, like, for example, while inspecting the 3 o'clock position of a stator, the guiding magnets 8 will not guide the self-guiding instrument carrier 17 exactly in the center of the rail. Depending on the weight of the self-guiding instrument carrier 17 and the angle of the rail on which it is running for inspection, gravity pulls the self-guiding instrument carrier 17 away from the center. Under stable conditions the component of the gravity forces on the self-guiding instrument carrier 17, which are parallel to the surface of the rail on which the self-guiding instrument carrier 17 is running, have to be compensated for by the magnetic guiding force $F_M$. Using the above described dependence of guiding force $F_M$ on the deviation d from the center of the rail, this deviation can be determined. In the 9 o'clock example, the guiding forces have to carry the whole weight of the self-guiding instrument carrier 17, and the deviation d can be calculated correspondingly.

Since the relation between angular position of the self-guiding instrument carrier 17 and deviation d from the center position can easily be determined with the described function above, a correction for the angular position can easily be applied. For example, the self-guiding instrument carrier 17 can be designed with a payload section 18 that can be moved out of the centerline of the self-guiding instrument carrier 17 to compensate for the deviation d, where the center line is the line of the self-guiding instrument carrier 17, which is above the center of and parallel to the ferromagnetic, respectively non-magnetic rail when no gravitation forces pull the self-guiding instrument carrier 17 to the side of the rail. Alternatively, the deviation d can be simply compensated for analytically when processing and evaluating the data recorded by an inspection instrument like an ultrasound sensor or, in case the payload includes a robot, the deviation can be corrected by the control of this robot.

Figure 8:
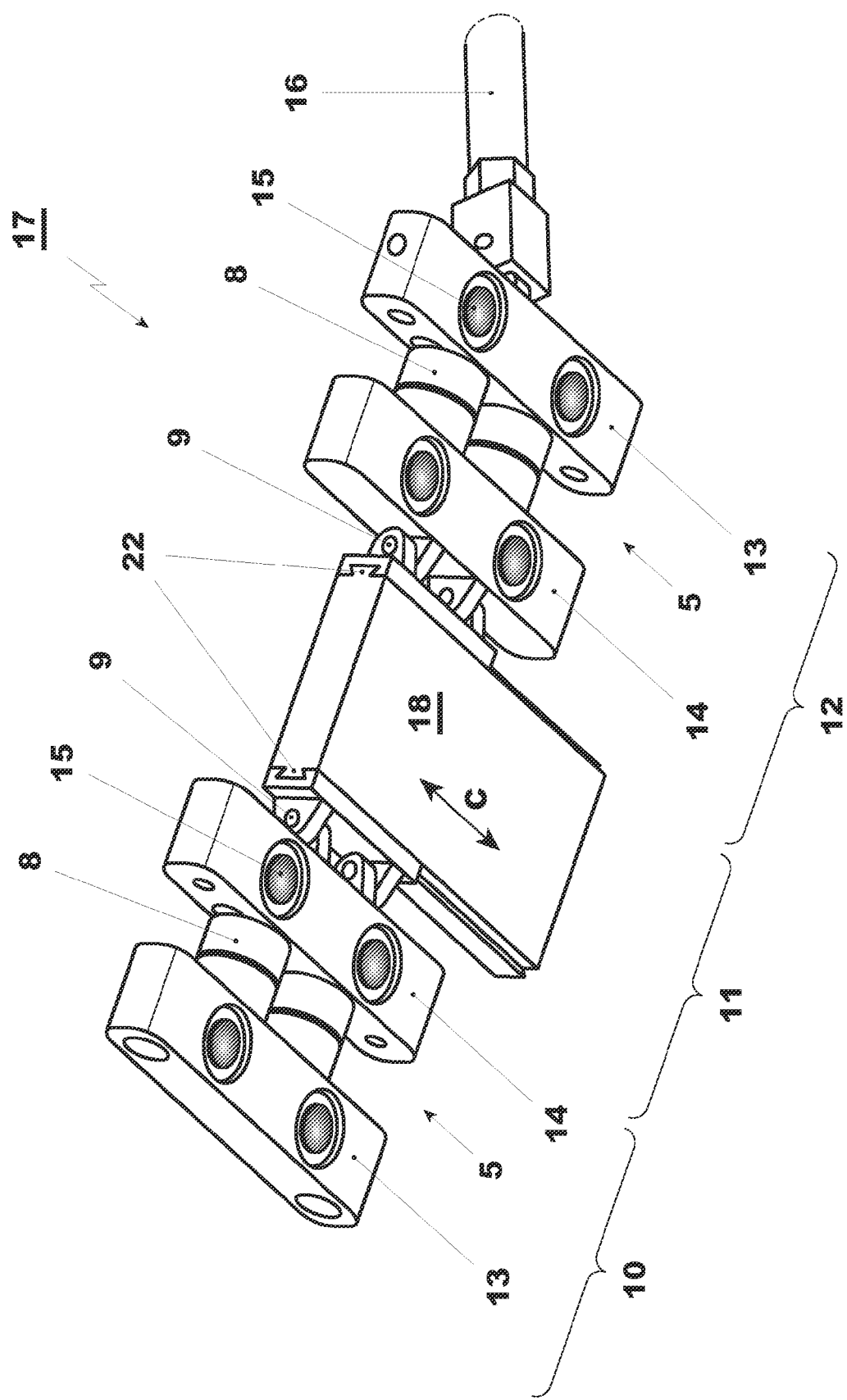
FIG. 8 Example of a self-guiding instrument carrier 17 with compensation C of the position of the payload section 18 for deviation d of the centerline of the carriage 5.

In FIG. 8 an example of a self-guiding instrument carrier 17 with compensation C of the position of the payload section 18 for deviation d from the centerline of the carriage 5 is shown. It is based on the example of a three-segment device as shown in FIG. 7. In addition to the components shown in FIG. 7, the payload section 18 is divided into the payload itself and two dove tail cross section mounting bars 22. The mounting bars 22 are connected with the hinges 9 to the adjacent carriages 5 of the first section 10 and the third section 12. The mounting bars are arranged parallel to the surface on which the self-guiding instrument carrier 17 is running and normal to the axial direction A of the guiding ferromagnetic or non-magnetic rails 3, 4. The payload itself is connected to the mounting bars 22 with dovetail cross-section tapered shoes, which are attached to or integrated into the payload or payload housing. The payload can be moved along the dovetail out of the centerline of the carriage. Thus the dovetail connection between mounting bars 22 and payload 18 allow correcting the position of the payload by a compensation C for a deviation d of the centerline of the self-guiding instrument carrier 17.

For example, the cylindrical guidance magnets 6 do not need to be axially magnetized in applications where pairs of guidance magnets are used for guidance, as shown in FIGS. 5 and 6, if they are not axially pivoted due to a deviation from the center. Other magnet geometries are also feasible as, for example, bar magnets. Further, electromagnets can be used. This can be advantageous for heavy self-guiding generator instrument carriers 17, because the specific magnetic force of electromagnets can be higher than of permanent magnets. They can also be switched off to facilitate the removal of the self-guiding instrument carrier 17 from the annual gap 7 or the transfer from one rail to the next.

In addition to the guidance magnets 8, load magnets can be applied to carry the weight of the self-guiding instrument carrier 17. They press the self-guiding instrument carrier 17 against the generator stator 1 or rotor 2, irrespective of the part of the generator which is to be inspected or repaired. This allows, for example, the overhead inspection of any part of the stator.

LIST OF REFERENCE SYMBOLS 1 generator stator
2 generator rotor
3 ferromagnetic material/ferromagnetic rail
4 non-magnetic material/non-magnetic rail
5 carriage
6 cylindrical guidance magnet
7 annular gap
8 guidance magnet
9 hinge
10 first section
11 second section
12 third section
13 first yoke
14 second yoke
15 roller bearing
16 rod
17 self-guiding instrument carrier
18 payload section (sensors, tools, miniature robot)
19 roller
20 generator
21 reference point
22 mounting bar
A axial direction parallel to generator rotor axis
C compensation for deviation from the centerline of a carriage
d deviation from center of the ferromagnetic rail
$F_M$ magnetic force While the invention has been described in detail with reference to exemplary embodiments thereof, it will be apparent to one skilled in the art that various changes can be made, and equivalents employed, without departing from the scope of the invention. The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments as are suited to the particular use contemplated. It is intended that the scope of the invention be defined by the claims appended hereto, and their equivalents. The entirety of each of the aforementioned documents is incorporated by reference herein.

What is claimed is:

1. A method for guiding an instrument carrier in the annular gap between a stator and a rotor of a generator, the generator having an axially extending rail-like structure defined by alternating ferromagnetic rails and non-magnetic rails of the stator and of the rotor, the method comprising:
   axially guiding the instrument carrier; and
   passively centering the instrument carrier with magnets, including allowing free axial and circumferential movement of each wheel, ball, roller bearing or roller of the instrument carrier.

2. A method according to claim 1, wherein said magnets comprise at least one axially magnetized cylindrical guidance magnet.

3. A method according to claim 1, wherein said ferromagnetic rails have widths, and wherein said magnets comprise at least one pair of guidance magnets spaced apart to fit the width of a ferromagnetic rail.

4. A method according to claim 1, wherein said magnets comprise at least one pair of guidance magnets spaced apart to reach from one ferromagnetic rail across a non-magnetic rail to a second ferromagnetic rail, and wherein guiding comprises guiding on the non-magnetic rail.

5. A method according to claim 1, further comprising:
   mechanically adjusting the position of a payload of an instrument carrier to compensate for a deviation d from a centerline of a rail due to gravitational forces.

6. A method according to claim 1, further comprising:
   correcting data obtained from the payload of an instrument carrier for a deviation d from a center line of a rail due to gravitational forces.

7. An instrument carrier for the inspection and/or repair of a generator stator and/or rotor, at least one of the stator and rotor having at least one ferromagnetic rail having a width, the generator including an annular gap, the carrier comprising:
   at least one guidance magnet configured and arranged to have a magnetic field that interacts with said at least one ferromagnetic rail; and
   wheels, balls, roller bearings, or rollers, each configured and arranged to allow free axial and circumferential movement of the instrument carrier in the generator annular gap.

8. An instrument carrier according to claim 7, wherein the at least one guidance magnet comprises at least one axially magnetized cylindrical guidance magnet with an axis alignable parallel to and centered above the at least one ferromagnetic rail.

9. An instrument carrier according to claim 7, wherein the at least one guidance magnet comprises at least one pair of guidance magnets spaced apart to fit the width of and be centered above the at least one ferromagnetic rail.

10. An instrument carrier according to claim 7, wherein the at least one ferromagnetic rail comprises at least two ferromagnetic rails, wherein the at least one of the stator and rotor includes at least one non-magnetic rail between the at least two ferromagnetic rails, and wherein the at least one guidance magnet comprises at least one pair of guidance magnets spaced apart to reach from one of said at least two ferromagnetic rails across and centered above said at least one non-magnetic rail to a second of said at least two ferromagnetic rails.

11. An instrument carrier according to claim 7, further comprising:
   an axially pivotable cylindrical guidance magnet having an end and an axis of rotation at a right angle to an axis of the cylindrical guidance magnet; and
   at least one wheel or roller which allows movement in an axial direction of the generator, the at least one wheel or roller attached below or at the end of the axially pivotable cylindrical guidance magnet.

12. An instrument carrier according to claim 7, further comprising:
   ball rollers configured and arranged to allow movement in an axial direction of the generator.

13. An instrument carrier according to claim 7, further comprising:
   at least one additional magnet configured and arranged to pull the instrument carrier to the surface of a ferromagnetic rail to support the weight of the instrument carrier.

14. An instrument carrier according to claim 7, further comprising at least two flexibly connected segments.

15. An instrument carrier according to claim 7, further comprising at least two self-guiding carriages and at least one payload section.

16. An instrument carrier according to claim 7, further comprising a pushing rod configured and arranged to permit manual movement of the instrument carrier through the annular gap.

17. An instrument carrier according to claim 7, further comprising at least one electric motor configured and arranged to permit movement of the instrument carrier in the annular gap.

18. An instrument carrier according to claim 7, further comprising at least one payload configured and arranged to allow adjustment of a payload position normal to the longitudinal axis of the instrument carrier and parallel to a surface on which the instrument carrier runs.

19. A rotating electrical machine comprising:
   a rotor, a stator, an air gap between the rotor and the stator, and at least one ferromagnetic rail in at least one of the rotor and the stator; and
   an instrument carrier according to claim 7 positioned in said air gap.

20. A rotating electrical machine according to claim 19, wherein the rotor and stator together form part of one of an electric motor and an electric generator.

* * * * *